(12) United States Patent
Rolfson

(10) Patent No.: US 6,395,432 B1
(45) Date of Patent: May 28, 2002

(54) METHODS OF DETERMINING PROCESSING ALIGNMENT IN THE FORMING OF PHASE SHIFT REGIONS

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/365,980

(22) Filed: Aug. 2, 1999

(51) Int. Cl.$^7$ .................................................. G03F 9/00
(52) U.S. Cl. .............................................. 430/5; 430/22
(58) Field of Search .............................. 430/5, 22, 30, 430/313, 314, 315, 316

(56) References Cited

U.S. PATENT DOCUMENTS

| | | | |
|---|---|---|---|
| 5,194,344 A | 3/1993 | Cathey, Jr. et al. | 430/5 |
| 5,194,345 A | 3/1993 | Rolfson et al. | 430/5 |
| 5,194,346 A | 3/1993 | Rolfson et al. | 430/5 |
| 5,225,035 A | 7/1993 | Rolfson | 156/643 |
| 5,240,796 A | 8/1993 | Lee et al. | 430/5 |
| 5,281,500 A | 1/1994 | Cathey et al. | 430/5 |
| 5,376,483 A | 12/1994 | Rolfson | 430/5 |
| 5,468,578 A | 11/1995 | Rolfson | 430/5 |
| 5,495,959 A | 3/1996 | Rolfson | 216/12 |
| 5,498,500 A | 3/1996 | Bae | 430/22 |
| 5,536,606 A | 7/1996 | Doan | 430/5 |
| 5,576,126 A | 11/1996 | Rolfson | 430/5 |
| 5,635,315 A | 6/1997 | Mitsui | 430/5 |
| 5,667,918 A | 9/1997 | Brainerd et al. | 430/5 |
| 5,667,919 A | 9/1997 | Tu et al. | 430/5 |
| 5,672,450 A | 9/1997 | Rolfson | 430/5 |
| 5,700,602 A | 12/1997 | Dao et al. | 430/5 |
| 5,756,235 A | 5/1998 | Kim | 430/5 |
| 5,766,805 A | 6/1998 | Lee et al. | 430/5 |
| 5,766,829 A | 6/1998 | Cathey, Jr. et al. | 430/394 |
| 5,770,338 A * | 6/1998 | Lim et al. | 430/22 |
| 5,795,688 A | 8/1998 | Burdorf et al. | 430/30 |
| 5,882,827 A | 3/1999 | Nakao | 430/5 |
| 5,888,674 A | 3/1999 | Yang et al. | 430/5 |
| 5,932,377 A * | 8/1999 | Ferguson et al. | 430/5 |
| 6,042,972 A | 3/2000 | Schulze | 430/5 |

FOREIGN PATENT DOCUMENTS

EP       965 884       12/1999

* cited by examiner

Primary Examiner—Mark F. Huff
Assistant Examiner—Saleha R. Mohamedulla
(74) Attorney, Agent, or Firm—Wells St. John P.S.

(57) ABSTRACT

In but one implementation in the fabrication of a phase shift mask, both process alignment in the formation of a phase shift alignment region and degree of phase shift of the phase shift alignment region is determined at least in part by using aerial image measurement equipment. In one implementation, aerial image measurement equipment is used to both determine phase shift of a phase shift alignment region at least in part by capturing a series of aerial images as a function of focus and to determine process alignment in the formation of the phase shift alignment region at least in part by measuring distance between spaced low intensity locations defined by an edge of the phase shift alignment region and an adjacent alignment feature edge. In one implementation, process alignment in the formation of a phase shift alignment region is determined at least in part by using aerial image measurement equipment to determine photoresist patterning alignment prior to etching material to form said phase shift alignment region. In one implementation, aerial image measurement equipment is used to determine photoresist patterning alignment for formation of a phase shift alignment region at least in part by measuring distance between spaced intensity change locations defined by an alignment feature edge beneath the photoresist and an edge of the photoresist.

42 Claims, 8 Drawing Sheets

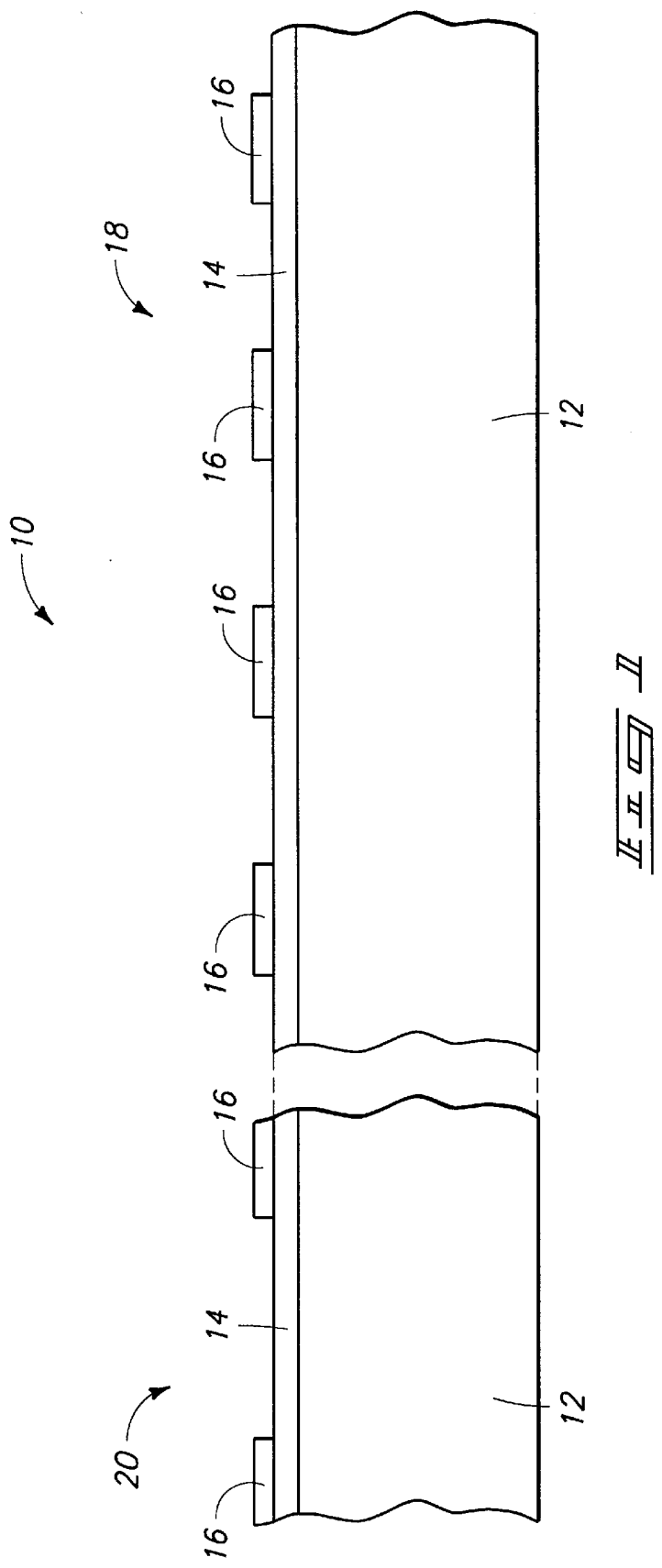

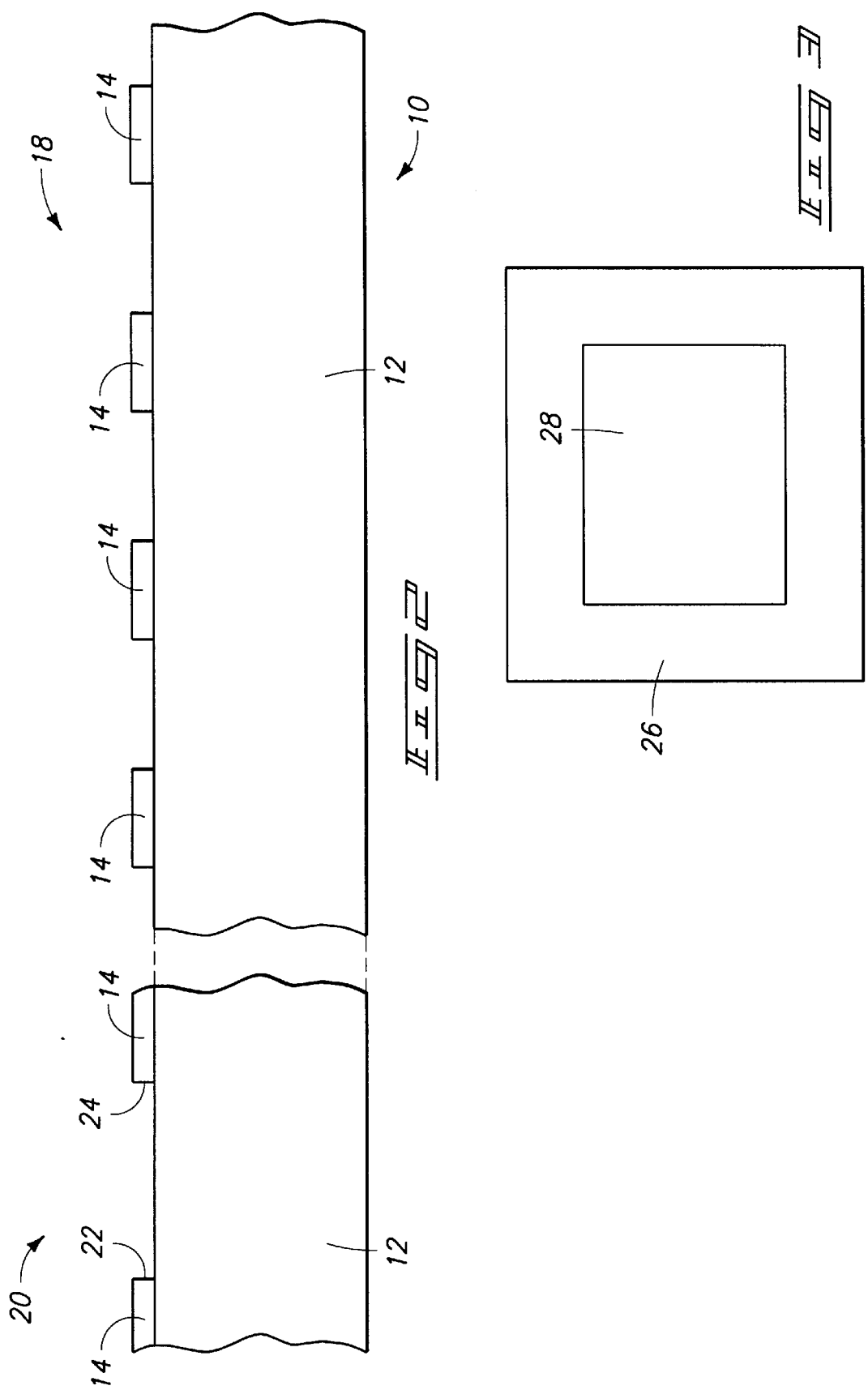

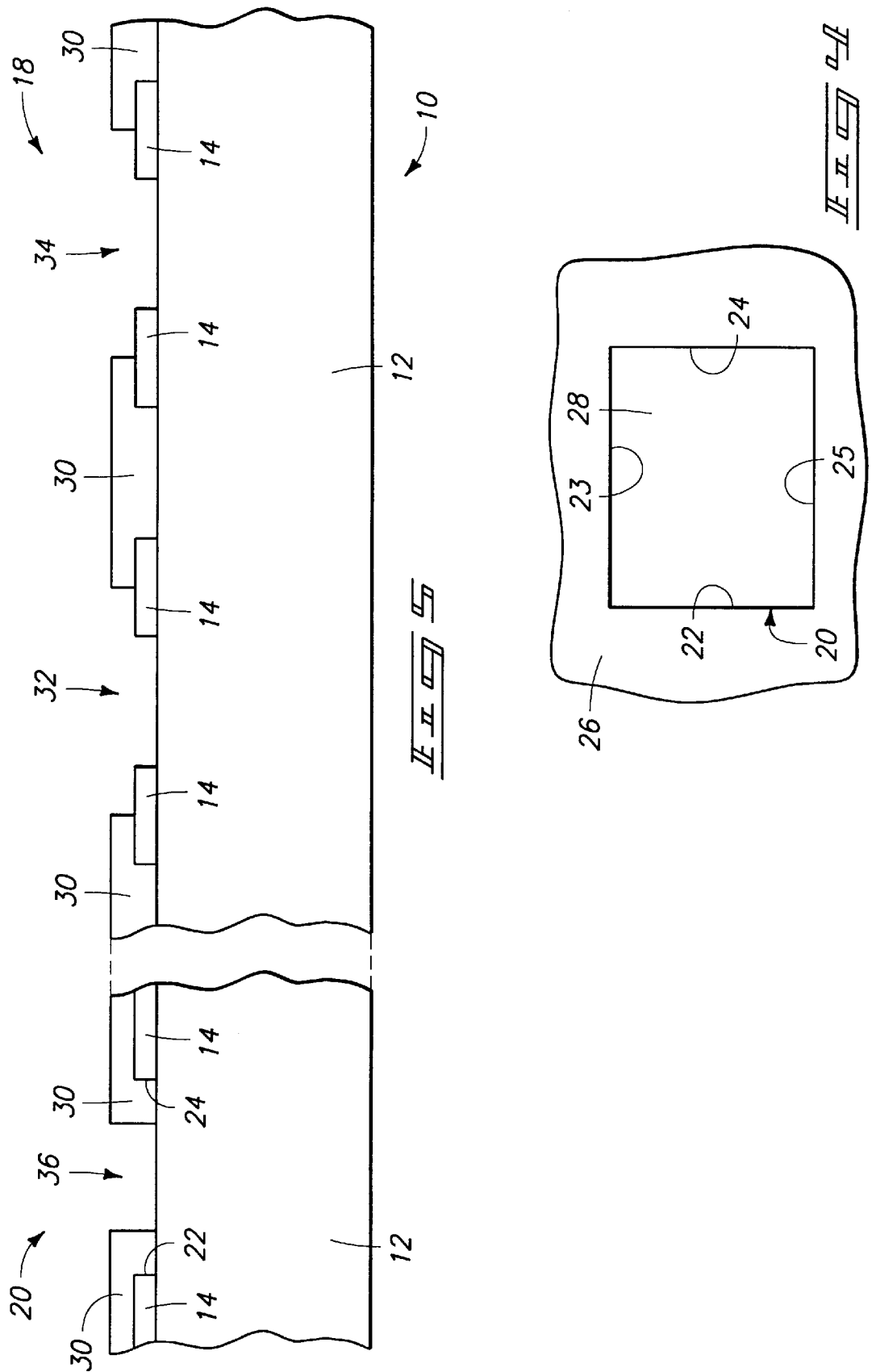

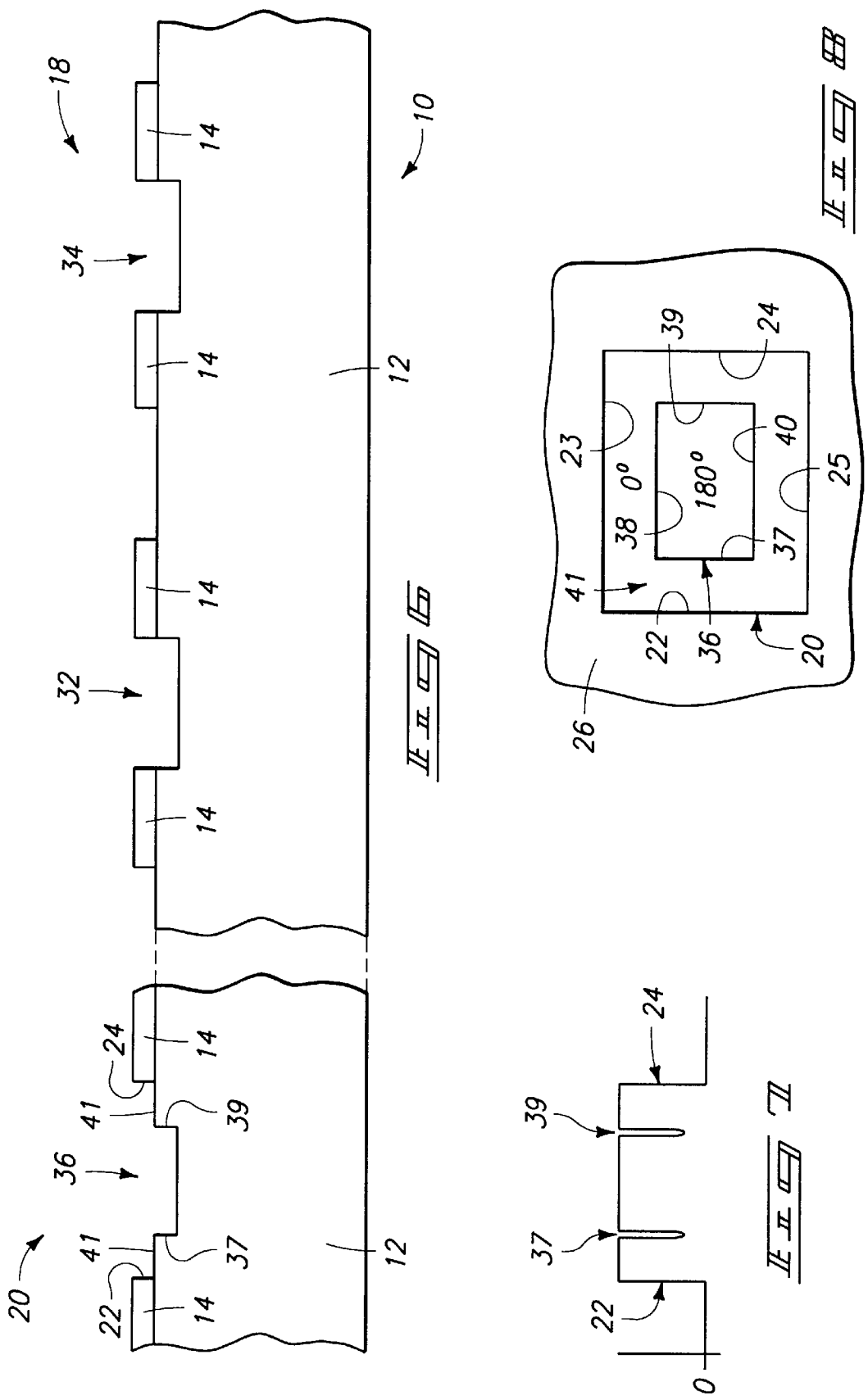

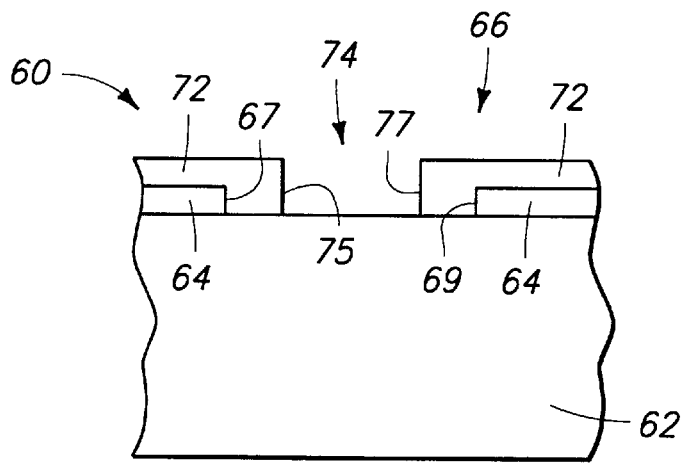
_FIG. 17_
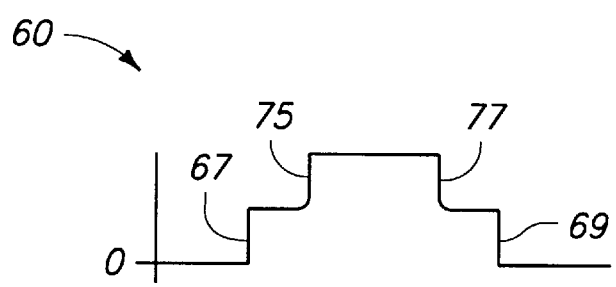
_FIG. 18_
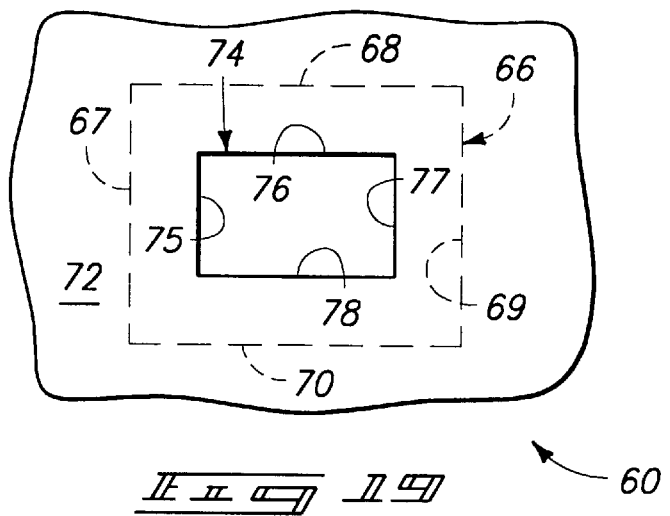
_FIG. 19_

METHODS OF DETERMINING PROCESSING ALIGNMENT IN THE FORMING OF PHASE SHIFT REGIONS

TECHNICAL FIELD

This invention relates to phase shift fabrication methods, to methods of determining processing alignment in the forming of phase shift regions in the fabrication of a phase shift mask, to methods of determining photoresist pattern alignment in the forming of phase shift regions in the fabrication of a phase shift mask, and to phase shift masks.

BACKGROUND OF THE INVENTION

In semiconductor manufacturing, photolithography is typically used in the formation of integrated circuits on a semiconductor wafer. During a lithographic process, a form of radiant energy such as ultraviolet light is passed through a mask/reticle and onto the semiconductor wafer. The mask contains light restricting regions (for example totally opaque or attenuated/half-tone) and light transmissive regions (for example totally transparent) formed in a predetermined pattern. A grating pattern, for example, may be used to define parallel-spaced conductive lines on a semiconductor wafer. The wafer is provided with a layer of photosensitive resist material commonly referred to as photoresist. Ultraviolet light passed through the mask onto the layer of photoresist transfers the mask pattern therein. The resist is then developed to remove either the exposed portions of resist for a positive resist or the unexposed portions of the resist for a negative resist. The remaining patterned resist can then be used as a mask on the wafer during a subsequent semiconductor fabrication step, such as ion implantation or etching relative to layers on the wafer beneath the resist.

Advances in semiconductor integrated circuit performance have typically been accompanied by a simultaneous decrease in integrated circuit device dimensions and in the dimensions of conductor elements which connect those integrated circuit devices. The wavelength of coherent light employed in photolithographic processes by which integrated circuit devices and conductors are formed has typically desirably been smaller than the minimum dimensions within the reticle or mask through which those integrated circuit devices and elements are printed. At some point, the dimension of the smallest feature opening within the reticle approaches the wavelength of coherent light to be employed. Unfortunately, the resolution, exposure latitude and depth of focus in using such reticles and light decreases due to aberrational effects of coherent light passing through openings of width similar to the wavelength of the coherent light. Accordingly as semiconductor technology has advanced, there has traditionally been a corresponding decrease in wavelength of light employed in printing the features of circuitry.

One approach for providing high resolution printed integrated circuit devices of dimensions similar to the wavelength of coherent light utilized employs phase shift masks or reticles. In comparison with conventional reticles, phase shift masks typically incorporate thicker or thinner transparent regions within the conventional chrome metal-on-glass reticle construction. These shifter regions are designed to produce a thickness related to the wavelength of coherent light passing through the phase shift mask. Specifically, coherent light rays passing through the transparent substrate and the shifter regions have different optical path lengths, and thus emerge from those surfaces with different phases. By providing transparent shifter regions to occupy alternating light transmitting regions of the patterned metal layer of a conventional phase shift mask of the Levenson type, adjacent bright areas are formed preferably 180° out-of-phase with one another. The interference effects of the coherent light rays of different phase provided by a phase shift mask form a higher resolution image when projected onto a semiconductor substrate, with accordingly a greater depth of focus and greater exposure latitude.

Another type of phase shift mask is referred to as an attenuated or half-tone phase shift mask. The attenuated phase shift mask has formed upon a transparent substrate a patterned semitransparent shifter layer. Such is typically formed of an oxidized metal layer which provides a 180° phase shift to the coherent light rays utilized with the mask, and produces a light transmissivity typically in a range of from 4% to 30%.

Certain equipment referred to as aerial image measurement equipment has been developed to determine the degree of phase shift obtained in the fabrication of phase shift regions. A goal or desire in the fabrication of such regions is to achieve exactly 180° out-of-phase from an adjacent reference region. In the fabrication however, the phase shift obtained might be some amount "off" of 180° depending upon the typical thickness change phase shift region which is obtained. One example aerial image measurement equipment is the Microlithography Simulation Microscope MSM 100™ available from Carl Zeiss, Inc. of Thornwood, N.Y.

SUMMARY

The invention comprises phase shift fabrication methods, methods of determining processing alignment in the forming of phase shift regions in the fabrication of a phase shift mask, methods of determining photoresist pattern alignment in the forming of phase shift regions in the fabrication of a phase shift mask, and phase shift masks. In but one implementation in the fabrication of a phase shift mask, both process alignment in the formation of a phase shift alignment region and degree of phase shift of the phase shift alignment region is determined at least in part by using aerial image measurement equipment. In one implementation in the fabrication of a phase shift mask, aerial image measurement equipment is used to both determine phase shift of a phase shift alignment region at least in part by capturing a series of aerial images as a function of focus and to determine process alignment in the formation of the phase shift alignment region at least in part by measuring distance between spaced low intensity locations defined by an edge of the phase shift alignment region and an adjacent alignment feature edge.

In one implementation in the fabrication of a phase shift mask, process alignment in the formation of a phase shift alignment region is determined at least in part by using aerial image measurement equipment to determine photoresist patterning alignment prior to etching material to form said phase shift alignment region. In one implementation in the fabrication of a phase shift mask, aerial image measurement equipment is used to determine photoresist patterning alignment for formation of a phase shift alignment region at least in part by measuring distance between spaced intensity change locations defined by an alignment feature edge beneath the photoresist and an edge of the photoresist.

BRIEF DESCRIPTION OF THE DRAWINGS

Preferred embodiments of the invention are described below with reference to the following accompanying drawings.

FIG. 1 is a diagrammatic sectional view of a phase shift mask substrate in process in accordance with an aspect of the invention.

FIG. 2 is a view of the FIG. 1 substrate at a processing step subsequent to that depicted by FIG. 1.

FIG. 3 is a reduced-scale top plan view of the FIG. 2 substrate.

FIG. 4 is an enlarged-scale top plan view of only a portion of the FIG. 2 substrate.

FIG. 5 is a view of the FIG. 2 substrate at a processing step subsequent to that shown by FIG. 2.

FIG. 6 is a side view of the FIG. 5 substrate at a processing step subsequent to that shown by FIG. 5.

FIG. 7 is a diagrammatic plot of light intensity as a function of position of a portion of the FIG. 6 substrate.

FIG. 8 is an enlarged-scale top plan view of a portion of the FIG. 6 substrate.

FIG. 17 is a diagrammatic sectional view of still another alternate embodiment phase shift mask substrate in process in accordance with an aspect of the invention.

FIG. 18 is a diagrammatic plot of light intensity as a function of position of the FIG. 17 substrate.

FIG. 19 is an enlarged-scale top plan view of FIG. 17.

DETAILED DESCRIPTION OF THE PREFERRED EMBODIMENTS

Figure 9:
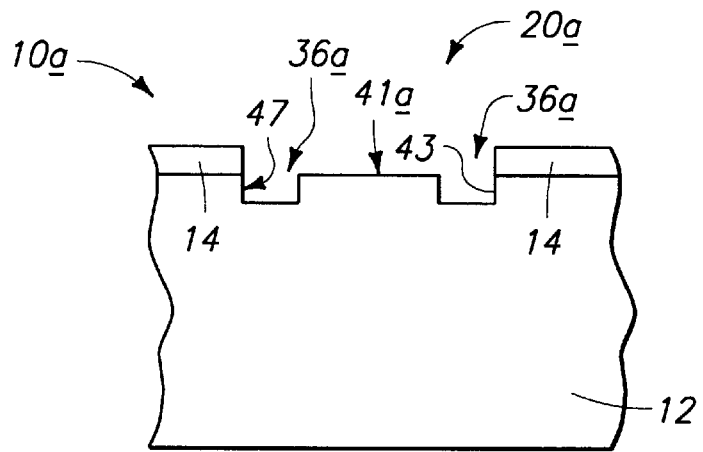
FIG. 9 is a diagrammatic sectional view of a portion of an alternate embodiment phase shift mask substrate at a processing step in accordance with the invention.

This disclosure of the invention is submitted in furtherance of the constitutional purposes of the U.S. Patent Laws "to promote the progress of science and useful arts" (Article 1, Section 8).

FIG. 1 depicts a phase shift mask substrate 10 during fabrication. Substrate 10 comprises a transparent substrate region 12, for example fused silica. An example thickness is 0.250 inches. A light shielding layer 14 is formed over transparent substrate 12. In the preferred and described example, light shielding layer 14 is preferably opaque to light transmission, with chromium being an example. An example thickness is 1000 Angstroms. A photoresist layer 16 has been deposited over light shielding layer 14 and patterned to form a desired circuitry pattern 18 and a non-circuitry alignment feature 20.

Referring to FIG. 2, exposed portions of light shielding layer 14 have been etched, and photoresist layer 16 (not shown) has been removed. Such provides but one example of patterning light shielding layer 14 to form a desired circuitry pattern 18 and to form a non-circuitry alignment feature 20. For purposes of the continuing discussion, non-circuitry alignment feature 20 has multiple edges depicted in the FIG. 2 and FIG. 4 sections as edges 22, 24 and 23, 25.

Referring to FIG. 3, phase mask substrate is preferably ultimately patterned to provide a peripheral frame area 26 which surrounds a circuitry pattern area 28. Circuitry pattern 18 is preferably received within circuitry pattern area 28, and non-circuitry alignment feature 20 is preferably received within frame 26.

Referring to FIG. 5, a second photoresist layer 30 has been deposited over substrate 10. Such has been patterned to form alternating phase shift regions 32, 34 within circuitry pattern area 18, and a phase shift alignment region 36 within non-circuitry alignment feature 20.

Referring to FIGS. 6 and 8, a timed etching has been conducted and photoresist layer 30 (not shown) has been removed, resulting in formation of a phase shift alignment region 36 within non-circuitry alignment feature 20. Phase shift alignment region 36 has multiple edges 37, 38, 39 and 40. Accordingly, phase shift alignment region 36 has at least one edge which is received within confines (i.e., at least partially) of non-circuitry alignment feature 20. Further as shown in the preferred embodiment, phase shift alignment region 36 is formed to be received entirely within confines of non-circuitry alignment feature 20. Further in the illustrated preferred embodiment, non-circuitry alignment feature 20 and phase shift alignment region 36 are formed to have essentially the same shape, but of different sizes. Further, phase shift alignment region 36 comprises no edge which coincides with any edge of non-circuitry alignment feature 20. Even further in the illustrated and preferred embodiment, phase shift alignment region 36 is surrounded by a non-phase shifting region 41 within non-circuitry alignment feature 20. Further, phase shift alignment region 36, in this example, is formed by a subtractive method, and further formed by a subtractive method and of the Levenson type. Attenuated or half-tone processing is also contemplated.

Phase shift alignment region 36 is preferably provided or attempted to be formed to provide a desired known spacing relative to non-circuitry alignment feature 20. For example, phase shift alignment region 36 is attempted to be formed to provide a desired known spacing between one or more non-circuitry alignment feature edge and a phase shift alignment region edge or edges, such as for example a desired alignment and spacing relative to pairs 37/22, 38/23, 39/24, and 40/25. Distance achieved between a phase shift alignment region edge and a non-circuitry alignment feature edge is determined and compared with a desired known spacing between such edges to evaluate process alignment therefrom. Such are preferably accomplished at least in part by measuring distance between light intensity change locations, and in the illustrated example most preferably by measuring distance between spaced low intensity locations.

For example, FIG. 7 depicts a light intensity profile across the far-left illustrated section of the associated illustrated portion of phase shift mask substrate 10. Viewing such intensity graph, and moving from left to right, zero light intensity is measured passing through substrate 10 in this illustrated example where opaque region 14 exists. Where edge 22 is reached, a significant peak in light intensity rises and flattens as intensity is measured across the left illustrated 0° region 41 (i.e., the non-phase change region) until reaching edge 37 of phase shift alignment region 36. Here, a null point in intensity results where the illustrated step occurs and where excessive interference occurs and essentially no light shines through substrate material 12 along this point or line. Continuing moving along the graph from left to right, an intensity peak rises and flattens until reaching phase shift alignment region edge 39, whereupon another null or low intensity location exists. Continuing the movement from left to right, an intensity peak results thereafter and flattens relative to the right-illustrated 0° phase region 41 until reaching edge 24 of non-circuitry alignment feature 20. There, opaque chrome masking occurs in the illustrated example from light shielding layer 14, whereupon intensity drops to zero again.

Since the designer knows the dimensions and size of the opening for forming non-circuitry alignment feature 20 and the desired positioning of phase shift alignment region 36 therewithin, the desired distance, for example, between non-circuitry alignment feature edge 22 and phase shift alignment region edge 37 is a known. Accordingly, the light intensity processing conducted to achieve the graph of FIG. 7 can be utilized to compare the achieved distance between spaced low intensity locations 22 and 37, and compared to the known to determine and evaluate process alignment in the example x-direction. Further, an intensity profile can be utilized relative to the y-direction, for example relative to distance acquired between non-circuitry alignment feature edge 23 and phase shift alignment region edge 38 to determine alignment in the y-direction. Thereby in the preferred embodiment, the alignment which was achieved can be determined.

Most preferably, equipment utilized to determine the respective distance between one or more pairs of edges comprises aerial image measurement equipment. One example aerial measurement equipment utilizable in accordance with the invention is the MSM Microlithography Simulation Microscope Model No. 100, available from Carl Zeiss, Inc. of Thornwood, N.Y. Such equipment can be utilized to achieve the intensity profile of a given substrate such as shown by example with respect to FIG. 7, and as well utilized to determine degree of phase shift achieved in phase shift alignment regions 32 and 34. Accordingly in the most preferred embodiment in the fabrication of a phase shift mask, both process alignment in the formation of a phase shift alignment region and determining degree of phase shift of the phase shift alignment region is determined, at least in part, by using aerial image measurement equipment. Further most preferably, such determinings are preferably derived from a single aerial image measurement equipment using step on the mask substrate.

Further in accordance with the preferred implementation in the fabrication of a phase shift mask, aerial image measurement equipment is used to both determine phase shift of a phase shift alignment region at least in part by capturing a series of aerial images as a function of focus, and to determine process alignment in the formation of the phase shift alignment region at least in part by measuring distance between spaced low intensity locations defined by an edge of the phase shift alignment region and an adjacent alignment feature edge. In the just described and illustrated example, the adjacent alignment feature edge is not defined by an edge of the phase shift alignment region. For example, alignment feature edge 22 is different from edge 37 of phase shift alignment region 36.

Figure 10:
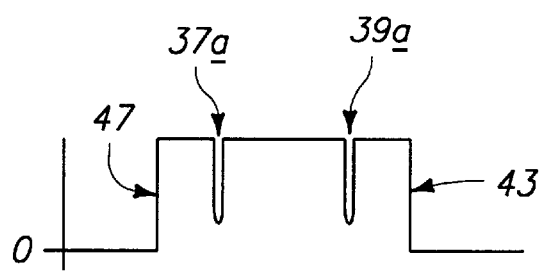
FIG. 10 is an light intensity plot as a function of position of the FIG. 9 substrate.
Figure 11:
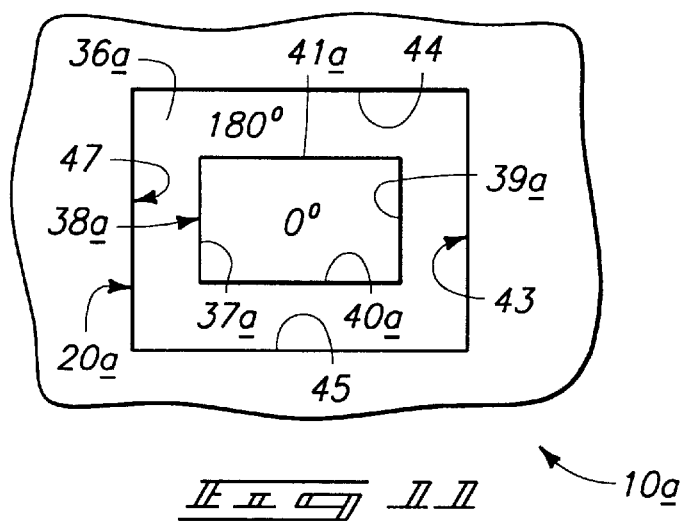
FIG. 11 is a top plan view of the FIG. 9 substrate.

Alternate preferred processing is next described with reference to FIGS. 9–11. Like numerals from the first described embodiment are utilized where appropriate, with differences being indicated with the suffix "a" or with different numerals. In the first described embodiment, and particularly as depicted in FIG. 8, the phase shift alignment region resulted from etch to form depression 36, and resulted in surrounding by a non-phase shifting region 41 within non-circuitry alignment feature 20. FIGS. 9 and 11 essentially illustrate the reverse, whereby the non-phase shifted region is defined by a phase shift alignment region 36a which surrounds a non-phase shifting region 41a within non-circuitry alignment feature 20a. Such is accomplished by forming the photoresist layer 30 of the first described embodiment (not shown) to mask, in this example, the same outline 36 in the first described embodiment within non-circuitry alignment feature 20 and in etching transparent substrate material 12 within non-circuitry alignment feature 20a thereabout.

Such still constitutes a subtractive phase shift mask forming method as transparent substrate material is removed to achieve a desired phase shifting region here and elsewhere on the substrate. Further in this example, phase shift alignment region 36a comprises an edge 47 which coincides with an edge of non-circuitry alignment feature 20a. In other words, non-circuitry alignment feature 20a and phase shift alignment region 36a share common edges in the illustrated edges 47, 43, 44 and 45. Accordingly, the adjacent alignment feature edge is defined by an edge of the phase shift alignment region. Intensity profile processing preferably otherwise occurs as described above to achieve the exemplary FIG. 10 profile.

Figure 12:
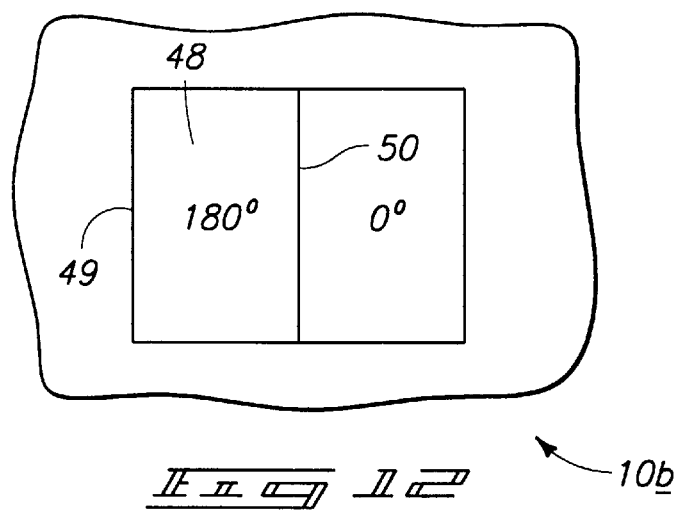
FIG. 12 is a top plan view of an alternate embodiment phase shift mask in process.

The above-described processing depicts examples where multiple edge pairs are provided from the phase shift alignment region and the non-circuitry alignment feature. FIG. 12 illustrates exemplary processing whereby only a single edge is achieved. Like numerals from the first described embodiment are utilized where appropriate with differences being indicated by the suffix "b" or with different numerals. Substrate 10b depicts a phase shift alignment region 48 formed within a non-circuitry alignment feature 49. Only a single phase shift alignment region edge 50 is shown being received within non-circuitry alignment feature 49. Accordingly, and knowing a desired aligned spacing between edges 49 and 50, light intensity could be monitored relative thereto to determine whether the appropriate distance was achieved, and thereby whether the appropriate alignment occurred at least relative to the illustrated x-direction.

Figure 13:
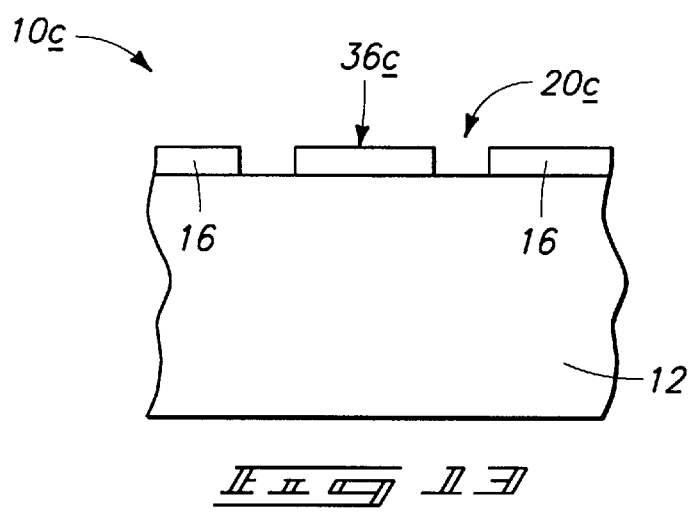
FIG. 13 is a diagrammatic sectional view of a portion of yet another alternate embodiment phase shift mask substrate in process in accordance with an aspect of the invention.
Figure 14:
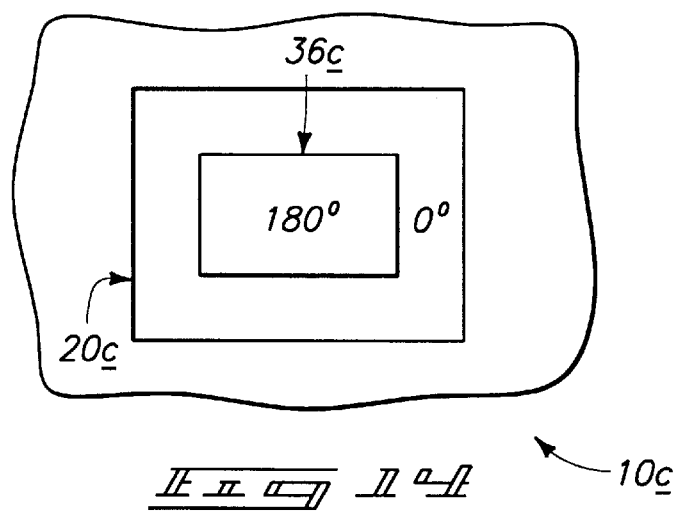
FIG. 14 is an enlarged-scale top plan view of FIG. 13.

All of the above described processing depicts exemplary subtractive methods of forming a phase shift alignment region. FIGS. 13 and 14 depict one example embodiment employing an additive method. Like numerals from the first described embodiment have been utilized where appropriate, with differences being indicated by the suffix "c". Here, the illustrated phase shift alignment region 36c is created by deposition of another transparent material and patterning thereof within a non-circuitry alignment feature 20c. Light intensity monitoring could otherwise occur as described above with respect to the first described embodiment.

Figure 15:
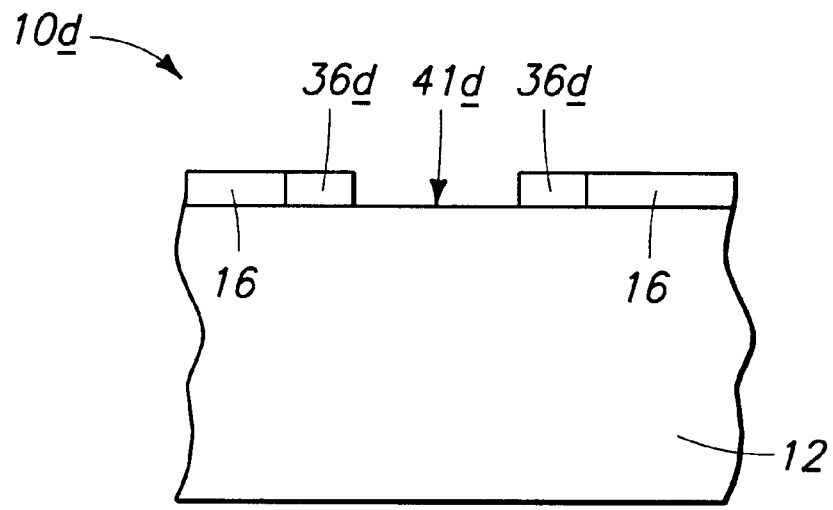
FIG. 15 is a diagrammatic sectional view of yet another alternate embodiment phase shift mask substrate in process in accordance with an aspect of the invention.
Figure 16:
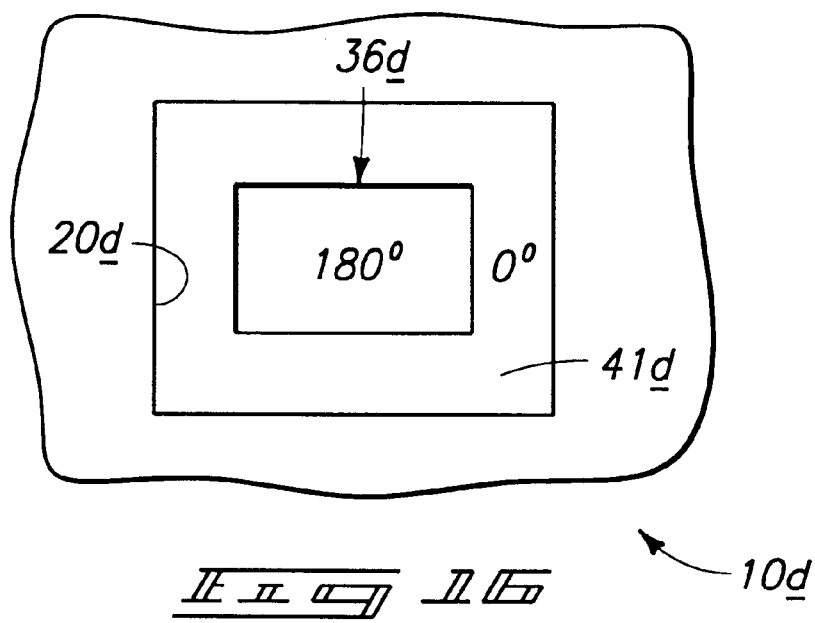
FIG. 16 is an enlarged-scale top plan view of FIG. 15.

FIGS. 15 and 16 illustrate an alternate method of forming a phase shift alignment region by an additive method. Like numerals from the first described embodiment are utilized where appropriate, with differences being indicated with different numerals or with the suffix "d". Here, the patterning corresponds relative to the subtractive method depicted by FIGS. 9–11 whereby a phase shift alignment region 36d is produced to surround a non-phase shifting region 41d within a non-circuitry alignment feature 20d.

In another implementation of the invention, a method of determining photoresist pattern alignment in the forming of phase shift regions in the fabrication of a phase shift mask is described with respect to an exemplary embodiment depicted in FIGS. 17–19. FIG. 17 depicts a phase shift mask substrate 60 in process which comprises a transparent substrate 62 having a light shielding layer 64 formed thereover. Light shielding layer 64 has been patterned to form a desired circuitry pattern, for example like circuitry pattern 18 as depicted in the first described embodiment, and to form a non-circuitry alignment feature 66, for example analogous to alignment feature 20 in the first described embodiment. Non-circuitry alignment feature 66 has been patterned to have multiple edges 67, 68, 69 and 70 (FIG. 19).

A photoresist layer 72 has been deposited over patterned light shielding layer 64. Photoresist layer 72 has been patterned for formation of a phase shift alignment region 74 within non-circuitry alignment feature 66. Photoresist 72 has phase shift alignment region edges 75, 76, 77 and 78 received within confines of non-circuitry alignment feature 66. Accordingly, phase shift alignment region includes at least one edge which is received within confines (i.e., at least partially) of non-circuitry alignment feature 66. Accordingly as in the above-described embodiment, the preferred photoresist phase shift alignment region 74 is formed to be received entirely within confines of non-circuitry alignment feature 66. Further, non-circuitry alignment feature 66 and photoresist phase shift alignment region 74 are formed to have the same shape, but different sizes.

Analogously to that described above, the distance between a photoresist phase shift alignment region edge and a non-circuitry alignment feature edge can be determined in comparing such determined distance with a desired known spacing to evaluate photoresist pattern alignment therefrom. Such evaluating is most preferably accomplished or done before using the photoresist layer as an etch mask. Thereby if the determining reveals a rejectable photoresist pattern alignment, such photoresist can be stripped from the mask. Then, more photoresist can be subsequently deposited and patterned to form the phase shift alignment region, and further intensity analysis conducted to see if better alignment was achieved.

As in the above-described embodiment, the preferred method for determining distance between such edges is by measuring distance between light intensity change locations, and most preferably utilizing aerial image measurement equipment such as that described above. For example, FIG. 18 depicts a plot of light intensity as a function of distance along an x axis for the wafer fragment construction of FIG. 17. Light intensity is 0 moving from left to right up until reaching edge 67 of light shielding layer 64. There, light transmission effectively occurs through both photoresist layer 72 and transparent substrate 62 at a substantially constant intensity until reaching photoresist phase shift alignment feature edge 75. There, another intensity peak occurs and remains substantially constant in moving from left-to-right until reaching photoresist phase shift alignment region edge 77, whereupon intensity drops to a constant level, until again reaching an edge 69 of non-circuitry alignment feature 66.

The above provides but one example in the fabrication of a phase shift mask of determining process alignment in the formation of a phase shift alignment region at least in part by using aerial image measurement equipment to determine photoresist patterning alignment prior to etching material to form the phase shift alignment region. As in both above described embodiments, such is preferably conducted utilizing a non-circuitry alignment feature in association with a corresponding phase shift alignment region specifically dedicated therefor.

The above-described processing also is one example in the fabrication of a phase shift mask of using aerial image measurement equipment to determine photoresist patterning alignment for formation of the phase shift alignment region at least in part by measuring distance between spaced intensity change locations defined by an alignment feature edge beneath the photoresist and an edge of the photoresist. Other methods are also, of course, contemplated, with the invention only being limited by the accompanying claims appropriately interpreted in accordance with the Doctrine of Equivalents.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. In the fabrication of a phase shift mask to be used in semiconductor device fabrication, determining both process alignment in the formation of a non-circuitry phase shift alignment feature and determining degree of phase shift of the non-circuitry phase shift alignment feature at least in part by using aerial image measurement equipment, the non-circuitry phase shift alignment feature comprising a step within the feature, the process alignment being determined by examining a radiation intensity profile across at least a portion of the feature which includes the step within the feature.

2. The method of claim 1 wherein the determinings are derived from a single aerial image measurement equipment using step on the mask.

3. The method of claim 1 wherein the determining the process alignment in the formation of the phase shift alignment feature comprises measuring distance between intensity change locations, at least one of the locations comprising the step formed within the feature.

4. The method of claim 3 wherein the determining the process alignment in the formation of the phase shift alignment feature comprises measuring distance between spaced low intensity locations, at least one of the locations comprising the step within the feature.

5. The method of claim 1 comprising forming the phase shift alignment feature by a subtractive method.

6. The method of claim 1 comprising forming the phase shift alignment feature by an additive method.

7. The method of claim 1 comprising forming the phase shift alignment feature by a subtractive method and of the Levenson type.

8. In the fabrication of a phase shift mask to be used in semiconductor device fabrication, using aerial image measurement equipment to both determine phase shift of a non-circuitry phase shift alignment feature at least in part by capturing a series of aerial images as a function of focus and determine process alignment in the formation of the non-circuitry phase shift alignment feature, the non-circuitry phase shift alignment feature comprising a step within the feature, the process alignment being determined at least in part by examining a radiation intensity profile across at least a portion of the feature which includes the step within the feature and an adjacent non-circuitry alignment feature edge by measuring distance between spaced low intensity locations defined by the step and feature.

9. A method of determining processing alignment in the forming of phase shift regions in the fabrication of a phase shift mask to be used in semiconductor device fabrication, comprising:

provviding a light shielding layer over a transparent substrate;

patterning the light shielding layer to form a desired circuitry pattern and to form a non-circuitry alignment feature, the non-circuitry alignment feature having an edge;

forming a phase shift alignment region within the non-circuitry alignment feature, the phase shift alignment region comprising a step which is received within confines of the non-circuitry alignment feature, the phase shift alignment region being formed in an effort to provide a desired known spacing between the non-circuitry alignment feature edge and the phase shift alignment region step; and determining the distance between the phase shift alignment region step and the non-circuitry alignment feature edge by examining a radiation intensity profile across the feature which includes the step within the feature and the feature edge and comparing said distance with the desired known spacing to evaluate process alignment therefrom.

10. The method of claim 9 wherein the light shielding layer is opaque.

11. The method of claim 9 wherein the phase shift mask defines a middle circuitry pattern area surrounded by a no-circuitry frame area, the non-circuitry alignment feature and the phase shift alignment region being formed in the frame area.

12. The method of claim 9 comprising patterning the non-circuitry alignment feature to have multiple edges, and forming the phase shift alignment region to have multiple steps.

13. The method of claim 12 comprising determining processing alignment in both x and y directions using at least two of the multiple edges of the non-circuitry alignment feature and at least two of the multiple steps of the phase shift alignment region.

14. The method of claim 9 comprising forming the non-circuitry alignment feature and the phase shift alignment region to have the same shape but different sizes, the phase shift alignment region being received entirely within confines of the non-circuitry alignment feature.

15. The method of claim 9 wherein the phase shift alignment region is formed to be received entirely within confines of the non-circuitry alignment feature.

16. The method of claim 15 wherein the phase shift alignment region comprises an edge which coincides with an edge of the non-circuitry alignment feature.

17. The method of claim 15 wherein the phase shift alignment region comprises no edge which coincides with any edge of the non-circuitry alignment feature.

18. The method of claim 15 wherein the phase shift alignment region is surrounded by a non-phase shifting region within the non-circuitry alignment feature.

19. The method of claim 15 wherein the phase shift alignment region surrounds a non-phase shifting region within the non-circuitry alignment feature.

20. The method of claim 9 wherein the determining the distance comprises measuring distance between intensity change locations.

21. The method of claim 20 wherein the determining the distance comprises using aerial image measurement equipment.

22. The method of claim 20 wherein the determining the distance comprises measuring distance between spaced low intensity locations.

23. The method of claim 22 wherein the determining the distance comprises using aerial image measurement equipment.

24. The method of claim 9 comprising forming the phase shift alignment region by a subtractive method.

25. The method of claim 9 comprising forming the phase shift alignment region by an additive method.

26. The method of claim 9 comprising forming the phase shift alignment region by a subtractive method and of the Levenson type.

27. In the fabrication of a phase shift mask to be used in semiconductor device fabrication, determining process alignment in the formation of a non-circuitry phase shift alignment region at least in part by using aerial image measurement equipment to determine alignment of a pattern formed in photoresist received on a substrate, and while the photoresist is on the substrate, prior to etching material to form said non-circuitry phase shift alignment region.

28. The method of claim 27 wherein the determining the process alignment in the formation of the phase -shift alignment region comprises measuring distance between intensity change locations.

29. The method of claim 27 wherein the determining photoresist patterning alignment reveals a rejectable photoresist pattern alignment, the method further comprising stripping all the photoresist from the mask after the revealing and prior to said etching, and subsequently depositing more photoresist, followed by patterning the more photoresist for formation of a phase shift alignment region, followed by conducting said determining said photoresist patterning alignment with respect to the more photoresist.

30. In the fabrication of a phase shift mask to be used in semiconductor device fabrication, using aerial image measurement equipment to determine alignment of a pattern formed in photoresist received on a substrate for formation of a non-circuitry phase shift alignment region at least in part by measuring distance between spaced intensity change locations defined by a non-circuitry alignment feature edge beneath the photoresist and an edge of the photoresist while the photoresist is on the substrate.

31. A method of determining photoresist pattern alignment in the forming of phase shift regions in the fabrication of a phase shift mask to be used in semiconductor device fabrication, comprising:

providing a light shielding layer over a transparent substrate;

patterning the light shielding layer to form a desired circuitry pattern and to form a non-circuitry alignment feature, the non-circuitry alignment feature having an edge;

depositing photoresist over the patterned light shielding layer;

patterning the photoresist for formation of a phase shift alignment region within the non-circuitry alignment feature, the photoresist having a phase shift alignment region edge which is received within confines of the non-circuitry alignment feature, the phase shift alignment region being formed in an effort to provide a desired known spacing between the non-circuitry alignment feature edge and the photoresist phase shift alignment region edge; and determining the distance between the photoresist phase shift alignment region edge and the non-circuitry alignment feature edge while the photoresist is on the substrate and comparing said distance with the desired known spacing to evaluate photoresist pattern alignment therefrom.

32. The method of claim 31 wherein the determining the distance comprises measuring distance between intensity change locations.

33. The method of claim 31 comprising using the patterned photoresist as an etch mask, the evaluating being done before using the photoresist as an etch mask.

34. The method of claim 33 wherein the determining the distance reveals a rejectable photoresist pattern alignment, the method further comprising stripping all the photoresist from the mask after the revealing and subsequently depositing more photoresist, followed by patterning the more photoresist for formation of a phase shift alignment region, followed by conducting said determining the distance with respect to the more photoresist.

35. The method of claim 31 wherein the phase shift mask defines a middle circuitry pattern area surrounded by a no-circuitry frame area, the non-circuitry alignment feature and the photoresist phase shift alignment region being formed in the frame area.

36. The method of claim 31 comprising patterning the non-circuitry alignment feature to have multiple edges, and forming the photoresist phase shift alignment region to have multiple edges.

37. The method of claim 36 comprising determining processing alignment in both x and y directions using at least two of the multiple edges of the non-circuitry alignment feature and at least two of the multiple edges of the photoresist phase shift alignment region.

38. The method of claim 31 comprising forming the non-circuitry alignment feature and the photoresist phase shift alignment region to have the same shape but different sizes, the photoresist phase shift alignment region being received entirely within confines of the non-circuitry alignment feature.

39. The method of claim 31 wherein the photoresist phase shift alignment region is formed to be received entirely within confines of the non-circuitry alignment feature.

40. The method of claim 31 wherein the determining the distance comprises measuring distance between intensity change locations.

41. In the fabrication of a phase shift mask, determining process alignment in the formation of a phase shift alignment region at least in part by using aerial image measurement equipment to determine photoresist patterning alignment prior to etching material to form said phase shift alignment region, the determining photoresist patterning alignment revealing a rejectable photoresist pattern alignment, the method further comprising stripping all the photoresist from the mask after the revealing and prior to said etching, and subsequently depositing more photoresist, followed by patterning the more photoresist for formation of said phase shift alignment region, followed by conducting said determining said photoresist patterning alignment with respect to the more photoresist.

42. A method of determining photoresist pattern alignment in the forming of phase shift regions in the fabrication of a phase shift mask comprising:

providing a light shielding layer over a transparent substrate;

patterning the light shielding layer to form a desired circuitry pattern and to form a non-circuitry alignment feature, the non-circuitry alignment feature having an edge;

depositing photoresist over the patterned light shielding layer;

patterning the photoresist for formation of a phase shift alignment region within the non-circuitry alignment feature, the photoresist having a phase shift alignment region edge which is received within confines of the non-circuitry alignment feature, the phase shift alignment region being formed in an effort to provide a desired known spacing between the non-circuitry alignment feature edge and the photoresist phase shift alignment region edge;

determining the distance between the photoresist phase shift alignment region edge and the non-circuitry alignment feature edge and comparing said distance with the desired known spacing to evaluate photoresist pattern alignment therefrom;

using the patterned photoresist as an etch mask, the evaluating being done before using the photoresist layer as an etch mask; and the determining the distance revealing a rejectable photoresist pattern alignment, the method further comprising stripping all the photoresist from the mask after the revealing and subsequently depositing more photoresist, followed by patterning the more photoresist for formation of said phase shift alignment region, followed by conducting said determining with respect to the more photoresist.

* * * * *